United States Patent [19]

Kennedy et al.

[11] Patent Number: 4,970,474

[45] Date of Patent: Nov. 13, 1990

[54] ANALOG/DIGITAL PHASE LOCKED LOOP

[75] Inventors: Richard A. Kennedy, Russiaville; Gregory J. Manlove; Jeffrey J. Marrah, both of Kokomo, all of Ind.

[73] Assignee: Delco Electronics Corporation, Kokomo, Ind.

[21] Appl. No.: 393,496

[22] Filed: Aug. 14, 1989

[51] Int. Cl.$^5$ .......................... H03L 7/06; H03L 7/07; H03L 7/099

[52] U.S. Cl. ........................................ 331/2; 331/1 A; 375/120; 455/208; 455/260

[58] Field of Search ................ 331/2, 17, 23, 25, 1 A; 375/81, 120; 455/208, 214, 260, 337

[56] References Cited

U.S. PATENT DOCUMENTS 4,180,783 12/1979 Khalifa ............................ 331/23 X
4,313,209 1/1982 Drucker ........................... 331/23 X
4,577,163 3/1986 Culp .................................. 331/1 A

*Primary Examiner*—David Mis
*Attorney, Agent, or Firm*—Albert F. Duke

[57] ABSTRACT

A phase locked loop (PLL) with a narrow bandwidth, and small phase noise which is particularly useful in a FM stereo decoder includes both analog and digital circuitry and has the advantages of both types of systems, performing better than standard PLL's without the need for any external components. An externally referenced digital voltage controlled oscillator, establishes the center frequency of the PLL while analog portions of the circuit permits accurate locking to the input signal and provides a high level of quietness of the system.

6 Claims, 4 Drawing Sheets

COMPOSITE
20
PHASE DETECTOR
22
LOW PASS FILTER
24
LOOP FILTER
REFERENCE
26
ANALOG/DIGITAL VCO
D19kHz
A19kHz
ANALOG VCO
LOOP FILTER
PHASE DETECTOR
14
12
10
16
÷ N
28

19 KHz
CTRL
96K

78
QB
Q
R
C
D
76
74
72
70
68
62
60
56
DIV 96
54
52
66
64
80
82
84
86
88
90
92
94
96
98
100
102
104
DELETE/L
ADD/L
7.2 MHz
RESET
DELETE
ADD

ANALOG/DIGITAL PHASE LOCKED LOOP

FIELD OF THE INVENTION

This invention relates to phase-locked loops (PLL) and more particularly to a PLL for a FM stereo decoder which includes an analog PLL incorporated in the feedback of a digital PLL.

BACKGROUND OF THE INVENTION

All FM stereo receivers must perform three functions. First, the decoder must detect and lock onto the 19 kHz pilot signal that is added to the FM composite for synchronization of the transmitter and receiver. This synchronization is accomplished with a PLL. Once locked, the decoder is in sync with the transmitted signal and the second function is performed, namely to multiply the FM composite signal by a 38 kHz signal that is in phase with the original 19 kHz pilot. This multiplication process brings the "Left–Right" signal down to the base band (0–15 kHz) making it possible to separate the "Left+Right" and the "Left–Right" information with simple low-pass filters. Thirdly, these signals are summed and differenced to give the desired "Left" and "Right" information reproduced at the speakers of a FM stereo receiver.

The accuracy and noise characteristics of the PLL are very important. Any noise on the 38 kHz signal generated in the PLL will appear in the "Left–Right" signal path. The noise in the signal path is an important measure of the decoder performance and must be minimized. Any inaccuracies in the PLL will cause the gain of the two signal paths to be mismatched. Gain mismatch will cause some "Left(Right)" channel information to be present on the "Right(Left)" output. The parameter called "separation" is a measure of how well the decoder separates the "Left" and "Right" signals and is therefore a benchmark for decoder performance.

A standard PLL is shown in FIG. 1. It is comprised of a phase detector 10, a loop filter 12, a VCO 14, and a frequency divider 16. In an analog system, the phase detector generates a voltage proportional to the difference in the phase between the output of frequency divider 16 and the system input. This voltage is fed through the loop filter 12 and then to the input of the VCO 14. When the VCO output is in phase with the incoming signal, the output of the phase detector 10 stops moving. If the frequency divider 16 is a divide by 2 and the PLL is locked to 19 kHz, the VCO output is 38 kHz, which is required in the decoder signal path.

Analog PLL's have analog VCO's which are inaccurate and are temperature dependent. Costly external components are required, and the bandwidth of the PLL must be widened to account for temperature variation, thereby reducing system performance. In a digital system, the operation of the circuitry is much the same except digital words are used instead of analog voltages. One such digital PLL is disclosed in U.S. Pat. No. 4,577,163. Digital PLL's have digital VCO's, the output frequency of which is controlled by an input bit pattern. The free running frequency of the PLL is very accurate, but the VCO output can only move in quantized steps of frequency. This frequency out is close to correct on the average, but at any one instant in time it may be incorrect. This quantization causes phase error which limits the performance of the FM stereo decoder.

SUMMARY OF THE INVENTION

The PLL of the present invention is a combined digital and analog circuit particularly useful in the decoder of a FM stereo receiver. The center frequency of the PLL is established with an analog/digital VCO referenced to an external squarewave generated with a crystal controlled oscillator. The VCO is described in detail in U.S. patent application Ser. No. 393,498 filed Aug. 14, 1989 by the assignee of the present invention, which is incorporated herein. The digital portion of the PLL accurately sets the center frequency. The analog portion of the circuit affects how the circuit locks onto a signal, and the overall quietness of the system. The PLL of the present invention is thus both analog and digital. It has the advantages of both types of systems, performing better than standard PLL's without the need for any external components.

Accordingly, it is an object of the present invention to provide a fully integrated phase-locked loop circuit with a narrow bandwidth, and small phase noise which is particularly useful in a FM stereo decoder.

BRIEF DESCRIPTION OF THE DRAWINGS

Other objects and advantages of the invention will become more apparent from the following description taken in conjunction with the accompanying drawings wherein like references refer to like parts and wherein.

Figure 2:
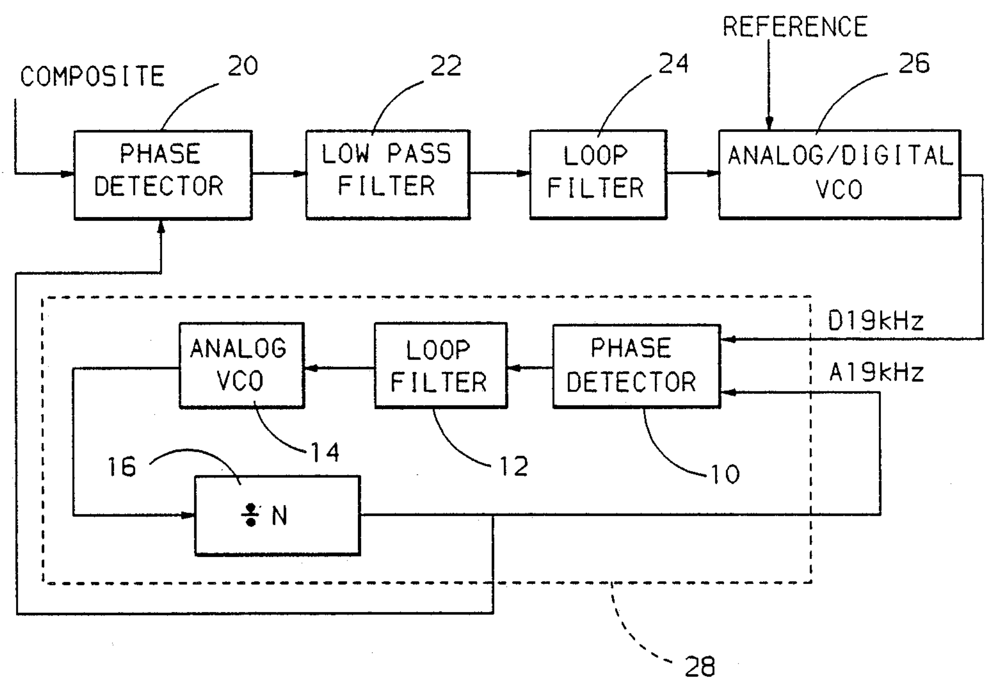
FIG. 2 is a block diagram of the present invention.

FIGS. **6*a*–6*c* are waveforms useful in explaining the operation of the analog and digital VCO shown in FIG. 2**.

DESCRIPTION OF THE PREFERRED EMBODIMENT

The analog/digital PLL of the present invention is shown in FIG. 2. It is comprised of a phase detector 20, a lowpass filter 22, a loop filter 24, an analog/digital VCO 26, and an analog PLL generally designated 28. A 3.6 MHz squarewave input is provided to the VCO 26 from a crystal controlled oscillator (not shown).

Figure 1:
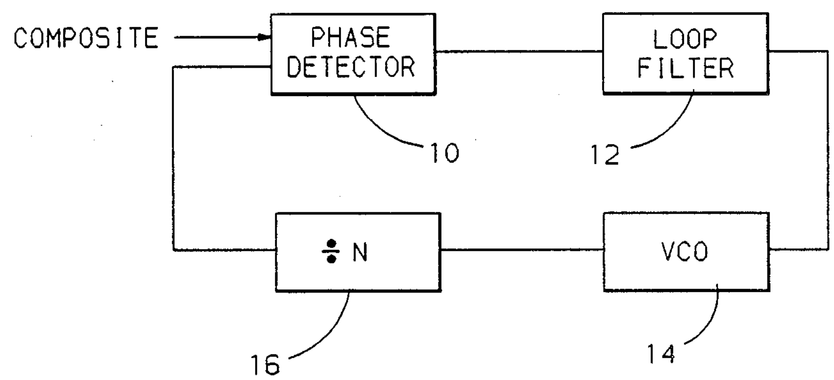
FIG. 1 is a block diagram of a conventional phase-locked loop.

The analog PLL 28 is conventional and includes the elements of FIG. 1 which are numbered accordingly. The phase detector 20 senses the phase difference between the 19 kHz feedback from the analog PLL 28 and the 19 kHz pilot signal in the FM composite. The remaining signals on the input are ignored because of the narrow bandwidth of the analog/digital VCO 26. This bandwidth is narrow because the free running frequency of the analog/digital VCO 26 is accurate to within 1.9 Hz of the 19 kHz pilot (0.01%). The output of phase detector 20 is fed through the filters 22 and 24 to the input of the analog/digital VCO 26. The output of the VCO 26 is a signal designated D19 kHz having the same frequency as the input pilot on the average; however, a slight phase error results at any instant in time due to the quantization error in the output frequency caused by the digital circuitry. The analog PLL 28, acts as a smoothing filter on the D19 kHz signal. It is an averaging circuit and only sees the desired 19 kHz signal. The output of the analog PLL is then used to generate the 38 kHz sinewave used in the signal path of the FM decoder. This signal will be exact in frequency due to the digital portion of the PLL, and it will have low phase noise due to the analog portion of the PLL. The analog PLL 28 may have a wide bandwidth without affecting the signal to noise ratio of the FM decoder because the input is D19 kHz, not the composite signal. Therefore the analog PLL may be fully integrated, requiring no external components.

Figure 3:
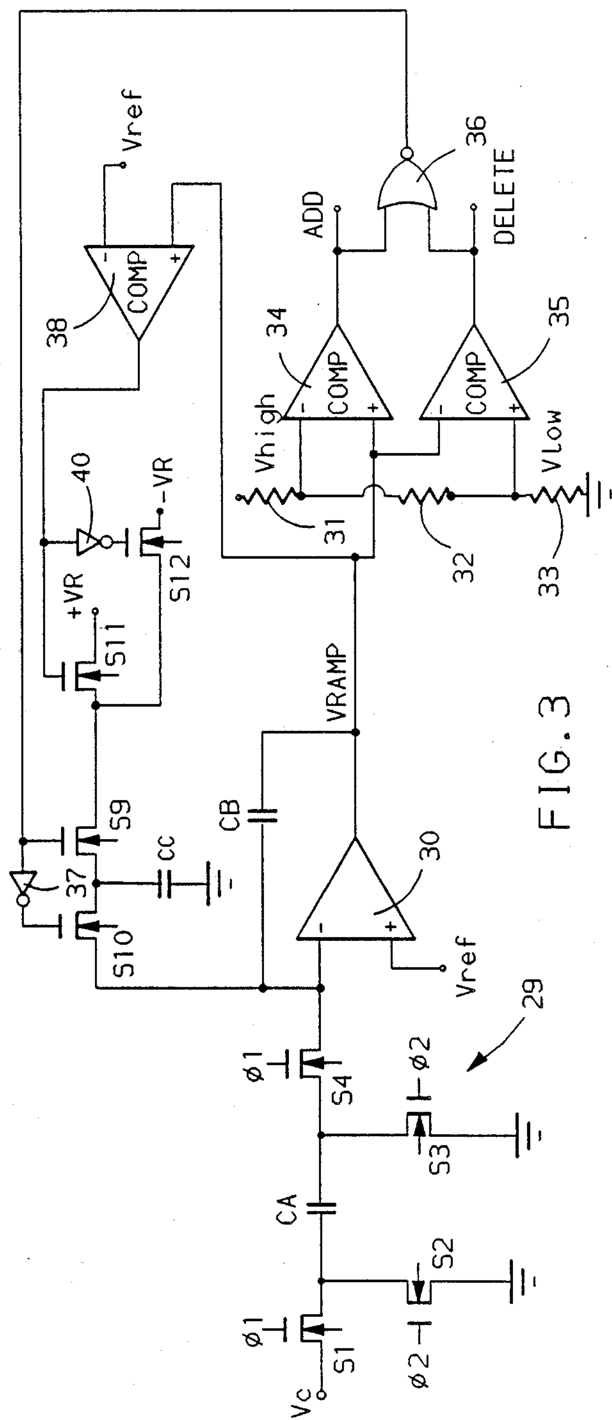
FIG. 3 is the analog stage of the combined analog and digital VCO shown in FIG. 2.

The signal D19 kHz has a main component at 19 kHz and smaller components at other frequencies, due to the phase noise of the digital circuitry. The analog PLL 28, locks onto the 19 kHz component of the D19 kHz input and ignores the other components caused by phase noise. As a result, the output of the analog VCO 14 is a low noise signal. This signal is reduced by the frequency divider 16 to generate the signal designated A19 kHz, a 19 kHz signal with low phase noise. This signal is the other input to the phase detector 20 of the analog/digital PLL as well as the input to the phase detector 10 of the analog PLL 28. The combined analog and digital VCO 26 is shown in detail in FIGS. 3 and 4 and is comprised of two basic sections. The first section is a voltage to pulse converter as shown in FIG. 3. The control voltage (Vc) for the VCO 26 is applied to a conventional switched capacitor integrator generally designated 29. If Vc is greater in amplitude than Vref, the output of an operational amplifier 30 (VRAMP) integrates toward ground. CA in conjunction with switches S1–S4 act as an equivalent resistor, which combines with CB and amplifier 30 to form an integrator. A voltage divider formed by resistors 31,32,33 establish reference inputs Vhigh to the negative input of comparator 34 and Vlow to the positive input of comparator 35. The outputs of comparators 34 and 35 designated ADD and DELETE respectively are applied as inputs to a NOR gate 36 the output of which is applied to switch S9 and through inverter 37 to switch S10 to control capacitor CC. A voltage +VR is applied to S9 through switch S11 or a voltage −VR is applied to S9 through switch S12 under the control of comparator 38 which responds to the VRAMP output of amplifier 30. The output of comparator 38 is connected directly to S11 and through inverter 40 to S12. When VRAMP goes below Vlow, the DELETE signal goes high and switches S10 on. When switch S10 conducts, the ramp is then reset by taking a fixed charge off the capacitor CB equal to CC times VR. When the ramp resets, the DELETE signal goes low and the process continues with VRAMP integrating towards ground. This allows the output to be fully continuous in voltage; thereby allowing the output frequency to be exact on the average.

If Vc is lower in amplitude than Vref, the output of the opamp (VRAMP) integrates toward supply. When VRAMP goes above Vhigh, the ADD signal goes high and the switch S9 is turned on and the switch S10 is turned off. The ramp is then reset by taking a fixed charge off the capacitor CB equal to CC times −VR. When the ramp resets, the ADD signal goes low and the process continues with VRAMP integrating towards supply. The RC time constant of the integrator and the difference in amplitude between Vc and Vref determine the average rate of DELETE or ADD pulses. The integrator averages out small perturbations on the Vc line which makes the circuit less sensitive to noise. Unlike the conventional switched capacitor VCO, the SC integrator merely controls the gain of the analog/digital VCO, not the free running frequency. Gain is not as important a parameter in the operation of the PLL, and any small gain inaccuracy in this circuit does not limit the PLL system performance.

Figure 4:
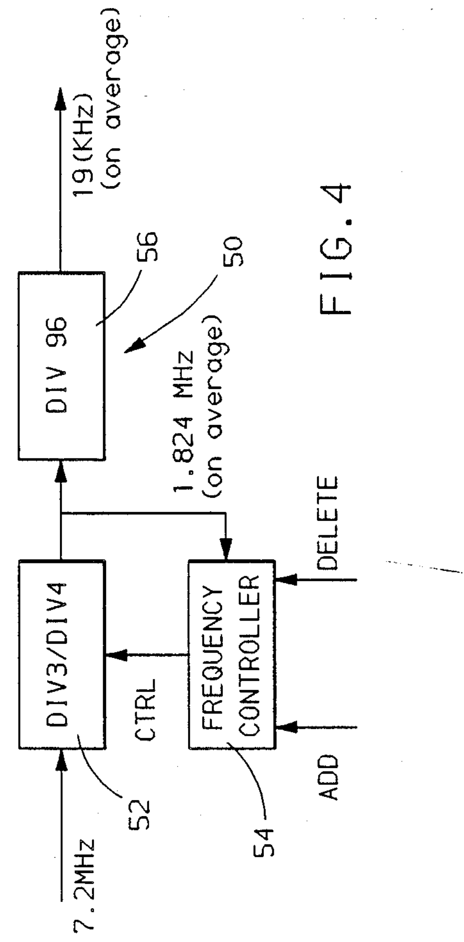
FIG. 4 is a block diagram of the digital stage of the combined analog and digital VCO shown in FIG. 2.

Referring now to FIG. 4, the second section of the analog/digital VCO is a digital divider generally designated 50 which produces (on average) a 19 kHz output based on a 7.2 MHz reference signal. This reference signal is a doubled version of a 3.6 MHz clock crystal reference. The divider 50 comprises a jitter divider 52 which divides the 7.2 MHz input by a factor of 3 or a factor of 4 under the control of frequency controller 54. The controller 54 responds to the ADD and DELETE pulses of the circuit of FIG. 3 and provides a CTRL signal for placing the divider 52 in a divide by 3 or a divide by 4 mode. In the absence of ADD or DELETE pulses the controller 54 provides for one divide by 3 followed by twenty four divide by 4 operations. This provides an output which is 1.824 MHz on the average. Divider 56 divides this signal by 96 to generate the desired 19 kHz output. Because the frequency of the crystal reference is accurate to within 0.01%, the 19 kHz output is accurate to within 1.9 Hz. The digital divider normally runs with the ratio of divide by three's and divide by four's as indicated above. An ADD or DELETE pulse either adds an extra divide by 3 or deletes a standard divide by 3 operation. This results in an slight change in the output frequency from the divider 56.

Figure 5:
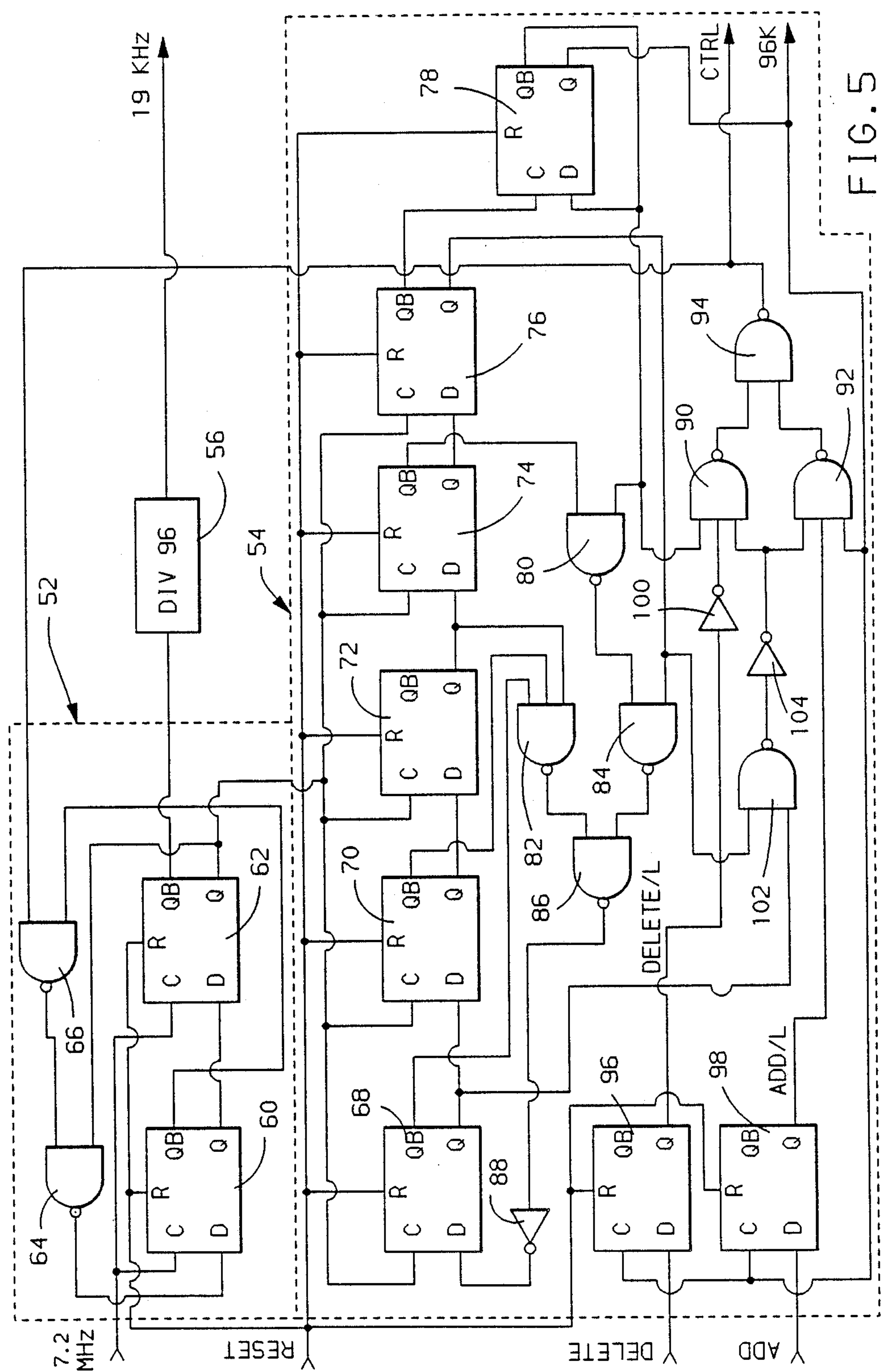
FIG. 5 is a more detailed logic diagram of the block diagram of FIG. 4.

The circuitry of FIG. 4 is shown in greater detail in FIG. 5 and will be further explained with reference to FIGS. *6a–6c*. The divider 52 comprises D-type flip flops 60 and 62 and Nand gates 64 and 66. Gate 66 is enabled by the CTRL signal going high, and places the divider 52 in the divide by 3 mode. The output of the divider 52 provides the clock for five D-Type flip flops 68–76 and a T-Type flip flop 78. The flip flops 68–74 are interconnected by Nand gates 80–86 and inverter 88 to produce a 96 kHz signal at the output of the flip flop 78. The 96 kHz signal alternately enables Nand gates 90 and 92 which provide inputs to Nand gate 94 which provides the CTRL output to the divider 52. The ADD and DELETE pulses of FIG. 3 are latched by flip flops 96 and 98 which are clocked from the 96 kHz signal and produce signals ADD/L and DELETE/L as shown in FIGS. *6a–6c*. When there are no ADD or DELETE pulses, as in FIG. *6a*, the gate 92 is disabled. The gate 90 is enable through inverter 100 during the time when the 96 kHz signal is low, i.e. when QB of flip flop 78 is high. The third input to gates 90 and 92 is from the flip flop 68 and 76 through Nand gate 102 and inverter 104 and positions the rising edge of the CTRL pulses.

In FIG. *6a*, both ADD/L and DELETE/L are low. Under this circumstance the jitter divider produces its normal 1.824 MHz output, providing the 19 KHz output from divider 56. It will be noted that a single CTRL pulse occurs each cycle of the 96 K signal, or each 75 cycles of the 7.2 MHz input. When CTRL is high a divide by 3 operation is performed during 3 of the 75 cycles. During the remaining 72 cycles the divider 52 operates as a divide by 4.

In FIG. *6b* ADD/L is high. This enables gate 92 when the 96 K signal is high and forces the output of gate 94 high when the Q output of flip flops 68 and 76 are high. This adds an extra divide by 3 operation, so that two divide by 3 operations occur during 75 cycles of the 7.2 MHz input. This extra divide by three occurs in place of a divide by 4 operation and increases the output frequency to its highest possible value of 1.82508 MHz, producing 19.0112 kHz at the output of the divider 56.

Figure 6A:
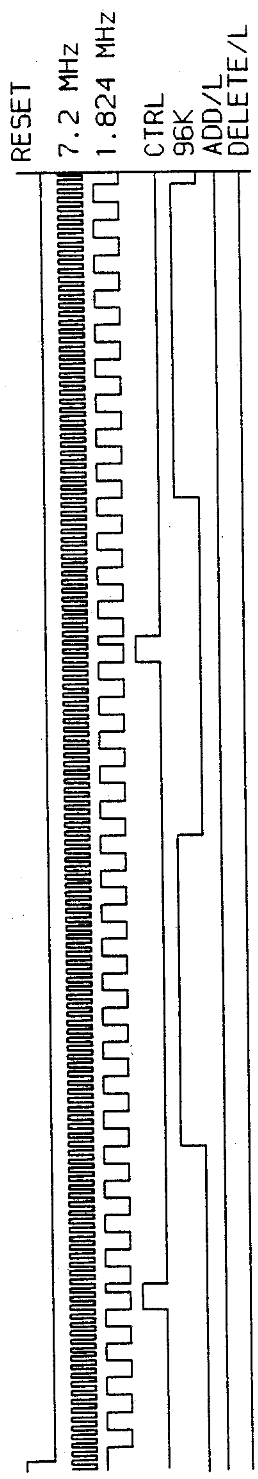
Figure 6B:
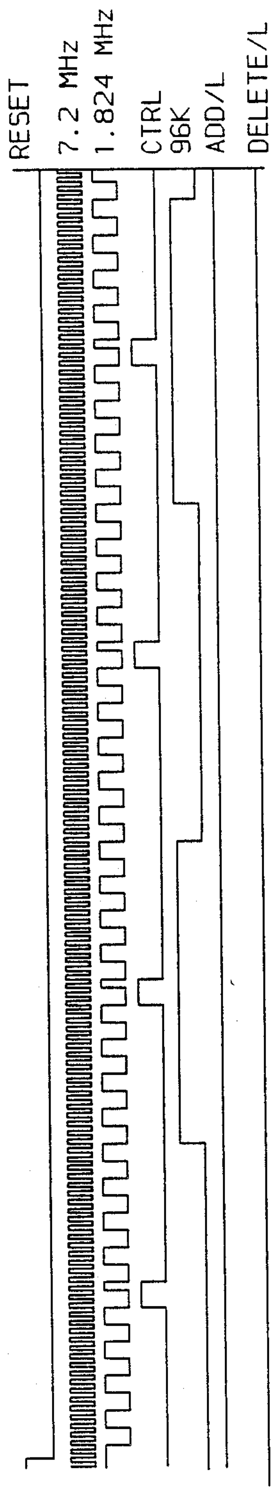
Figure 6C:
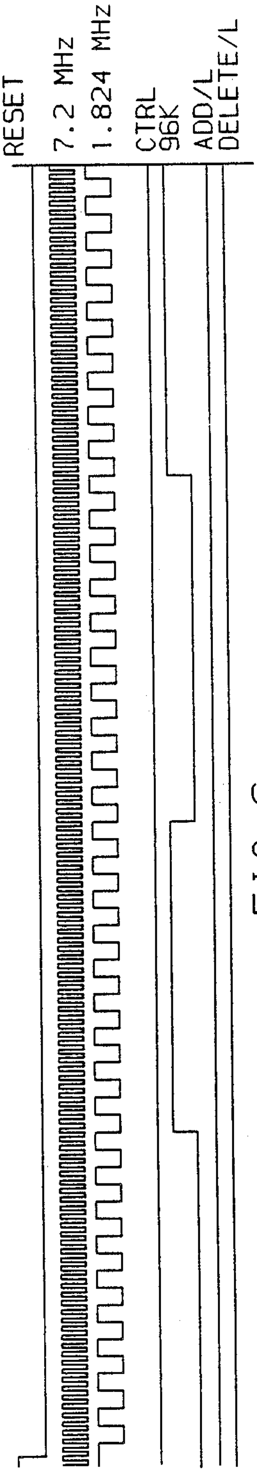

In FIG. 6c DELETE/L is high and disables the gate 90. This deletes the normal divide by 3 operation as long as DELETE remains high and decreases the output frequency to its lowest possible value of 1.82992 Mhz, producing 18.9888 kHz at the output of divider 56.

The ADD and DELETE pulses are in general never continuously high. Instead they are pulsed high to make small changes in the output frequency of the VCO. The average number of ADD or DELETE pulses, per unit time, affect the output frequency and are directly dependent on the input voltage Vc. The integrator time constant determines the gain of the system and a relatively large inaccuracy in the gain of the system has only a small effect on the performance of the PLL.

This circuit provides an accurate center frequency without the use of external components, and the phase error is minimized by having a large input to output clock ratio and fixed charge reset.

The PLL of the present invention minimizes phase error, and yields high performance realizing the accuracy of a digital PLL without the associated phase noise.

The PLL of the present invention minimizes phase error, and yields high performance realizing the accuracy of a digital PLL without the associated phase noise.

The embodiments of the invention in which an exclusive property or privilege is claimed are defined as follows:

1. A phase locked loop comprising analog/digital voltage controlled oscillator means, first phase detector means adapted to receive an FM composite input signal including a pilot signal, first filter means responsive to the output of said first phase detector means for providing an analog control input to said analog/digital voltage controlled oscillator means.

said analog/digital voltage controlled oscillator means receiving a reference input frequency signal from a reference oscillator source and including means providing an output signal which on average is equal to said pilot signal, an analog phase locked loop connected in the feedback path between said analog/digital voltage controlled oscillator means and said first phase detector means for averaging the output of said analog/digital controlled oscillator means, said analog phase locked loop comprising second phase detector means adapted to receive the output of said analog/digital voltage controlled oscillator means, analog voltage controlled oscillator means, second filter means responsive to the output of said second phase detector means for providing a control input to said analog voltage controlled oscillator means, means connecting the output of said analog voltage controlled oscillator means as a second input to said first and second phase detector means.

2. The invention defined in claim 1 wherein said analog/digital voltage controlled oscillator means has a center frequency equal to the frequency of said pilot signal and is referenced to the output of a crystal oscillator.

3. The invention defined in claim 1 wherein the means providing an output signal which on average is equal to said pilot signal includes divider means.

4. A digital phase locked loop containing an analog phase locked loop in the feedback path thereof, comprising first phase detector means adapted to receive a first input signal, a first voltage controlled oscillator including a jitter divider, a reference oscillator connected with said jitter divider for providing a reference input signal at a predetermined frequency, first filter means responsive to the output of said first phase detector means for providing a control voltage input to said first voltage controlled oscillator, said first voltage controlled oscillator further including frequency control means for controlling said jitter divider in response to said control voltage input to provide an output signal having on average the same frequency as said first input signal, said analog phase locked loop means comprising second phase detector means adapted to receive the output of said first voltage controlled oscillator, second voltage controlled oscillator means, second filter means responsive to the output of said second phase detector means and providing a control input to said second voltage controlled oscillator means, means connecting the output of said second voltage controlled oscillator means as a second input to said first and second phase detector means.

5. The invention defined in claim 4 wherein said first input signal is the 19 kHz pilot signal of an FM composite signal.

6. A digital phase locked loop containing an analog phase locked loop in the feedback path thereof, comprising first phase detector means adapted to receive a first input signal, digital controlled oscillator means, a reference oscillator connected with said digital controlled oscillator means for providing a reference input signal at a predetermined frequency, means responsive to the output of said first phase detector means for providing a control input to said digital controlled oscillator, said digital controlled oscillator means further including means responsive to said control input for providing an output signal having on average the same frequency as said first input signal, said analog phase locked loop comprising analog phase detector means adapted to receive the output of said digital controlled oscillator, analog voltage controlled oscillator means, second filter means responsive to the output of said analog phase detector means and providing a control voltage input to said analog voltage controlled oscillator means, means connecting the output of said analog voltage controlled oscillator means as a second input to said first phase detector means and said analog phase detector means.

* * * * *